United States Patent
Hanebutte

(10) Patent No.: US 7,383,137 B2
(45) Date of Patent: Jun. 3, 2008

(54) METHOD AND APPARATUS FOR MEASURING ABSOLUTE AND NET POWER CONSUMPTION FOR COMPUTER SYSTEMS

(75) Inventor: Ulf R. Hanebutte, Gig Harbor, WA (US)

(73) Assignee: Intel Corporation, Santa Clara, CA (US)

( * ) Notice: Subject to any disclaimer, the term of this patent is extended or adjusted under 35 U.S.C. 154(b) by 380 days.

(21) Appl. No.: 10/789,188

(22) Filed: Feb. 27, 2004

(65) Prior Publication Data

US 2005/0192766 A1    Sep. 1, 2005

(51) Int. Cl.
*G01R 31/36* (2006.01)
(52) U.S. Cl. .................... 702/57; 307/18; 713/300; 713/340; 702/60; 702/63
(58) Field of Classification Search ............ 702/57–58, 702/60, 183–185, 63; 324/500; 713/300, 713/322, 340, 310; 709/224; 455/456.1, 455/522; 307/18; 703/18; 710/63
See application file for complete search history.

(56) References Cited

U.S. PATENT DOCUMENTS

| | | | |
|---|---|---|---|
| 5,600,841 A * | 2/1997 | Culbert ........................ | 713/300 |
| 5,652,893 A * | 7/1997 | Ben-Meir et al. ........... | 713/310 |
| 6,285,886 B1 * | 9/2001 | Kamel et al. ................ | 455/522 |
| 6,907,482 B2 * | 6/2005 | Maciesowicz ............... | 710/63 |
| 2003/0009705 A1 * | 1/2003 | Thelander et al. .......... | 713/340 |
| 2003/0085621 A1 * | 5/2003 | Potega ......................... | 307/18 |
| 2003/0226049 A1 * | 12/2003 | Mantani ...................... | 713/322 |
| 2004/0243376 A1 * | 12/2004 | Karunaratne ................. | 703/18 |

* cited by examiner

*Primary Examiner*—John E Barlow, Jr.
*Assistant Examiner*—John H Le
(74) *Attorney, Agent, or Firm*—L. Cho

(57) ABSTRACT

A method for managing power data includes determining an amount of power used for a system running an application over a first time period from an operating system. An amount of power used for the system in a baseline state over a second time period is determined from the operating system. A net power consumption of the application is determined from the amount of power used for the system running the application and the amount of power used for the system in the baseline state.

28 Claims, 9 Drawing Sheets

| | | |
|---|---|---|
| 901 | ELAPSED TIME OF PROCESS | 758.6 SEC |
| 902 | ABSOLUTE POWER (POWER CAPACITY) | 7572 MWH |
| 903 | BACKGROUND POWER (POWER CAPACITY) | 3847 MWH |
| 904 | NET POWER (POWER CAPACITY) | 3725 MWH |
| 905 | ABSOLUTE POWER (DRAIN RATE) | 7585 MWH |
| 906 | BACKGROUND POWER (DRAIN RATE) | 3832 MWH |
| 907 | NET POWER (DRAIN RATE) | 3753 MWH |
| 908 | POWER CAPACITY UPDATE INTERVAL | 19 SEC |
| 909 | DRAIN RATE UPDATE INTERVAL | 19 SEC |
| 910 | SYSTEMATIC ERROR | .03 |

FIG. 9

METHOD AND APPARATUS FOR MEASURING ABSOLUTE AND NET POWER CONSUMPTION FOR COMPUTER SYSTEMS

TECHNICAL FIELD

Embodiments of the present invention pertain to power measurements in computer systems. More specifically, embodiments of the present invention relate to a method and apparatus for measuring absolute and net power consumption for computer systems running applications.

BACKGROUND

Continuing efforts have been made on several fronts to better manage power in computer systems in order to conserve electricity and extend battery life. Solutions for power conservation include improving designs of hardware components such as microprocessors, displays, and storage devices to make them more energy efficient. Solutions for power conservation also include the development of mechanisms in operating systems to allow computer users to adjust power to the display and hard disk as well as configure standby and hibernation modes of computer systems.

More recently, software developers have also taken the initiative to assess the effect of certain applications on power consumption on a computer system platform. In order for software developers to gather power data on applications, the computer system platform needed to be tested in a lab where measurement devices could be physically connected to the computer system platform to take accurate readings. This required additional resources that increased the cost and time of product development. The introduction of the smart battery has allowed some products to provide power consumption data for a computer system platform. These products, however, do not have the capability to determine the quality nor check the accuracy of the information supplied by the smart battery, nor do the products provide net power consumption information for an application being run on the computer system.

Thus, there exists a need for an efficient and effective method for determining the net power consumption of an application on a computer system platform.

BRIEF DESCRIPTION OF THE DRAWINGS

The features and advantages of embodiments of the present invention are illustrated by way of example and are not intended to limit the scope of the embodiments of the present invention to the particular embodiments shown.

FIG. 1 illustrates a block diagram of a computer system in which an embodiment of the present invention resides in.

FIG. 9 is a table illustrating information generated by the power evaluation unit according to an embodiment of the present invention.

DETAILED DESCRIPTION

In the following description, for purposes of explanation, specific nomenclature is set forth to provide a thorough understanding of embodiments of the present invention. However, it will be apparent to one skilled in the art that these specific details may not be required to practice the embodiments of the present invention. In other instances, well-known circuits, devices, and programs are shown in block diagram form to avoid obscuring embodiments of the present invention unnecessarily.

Figure 1:
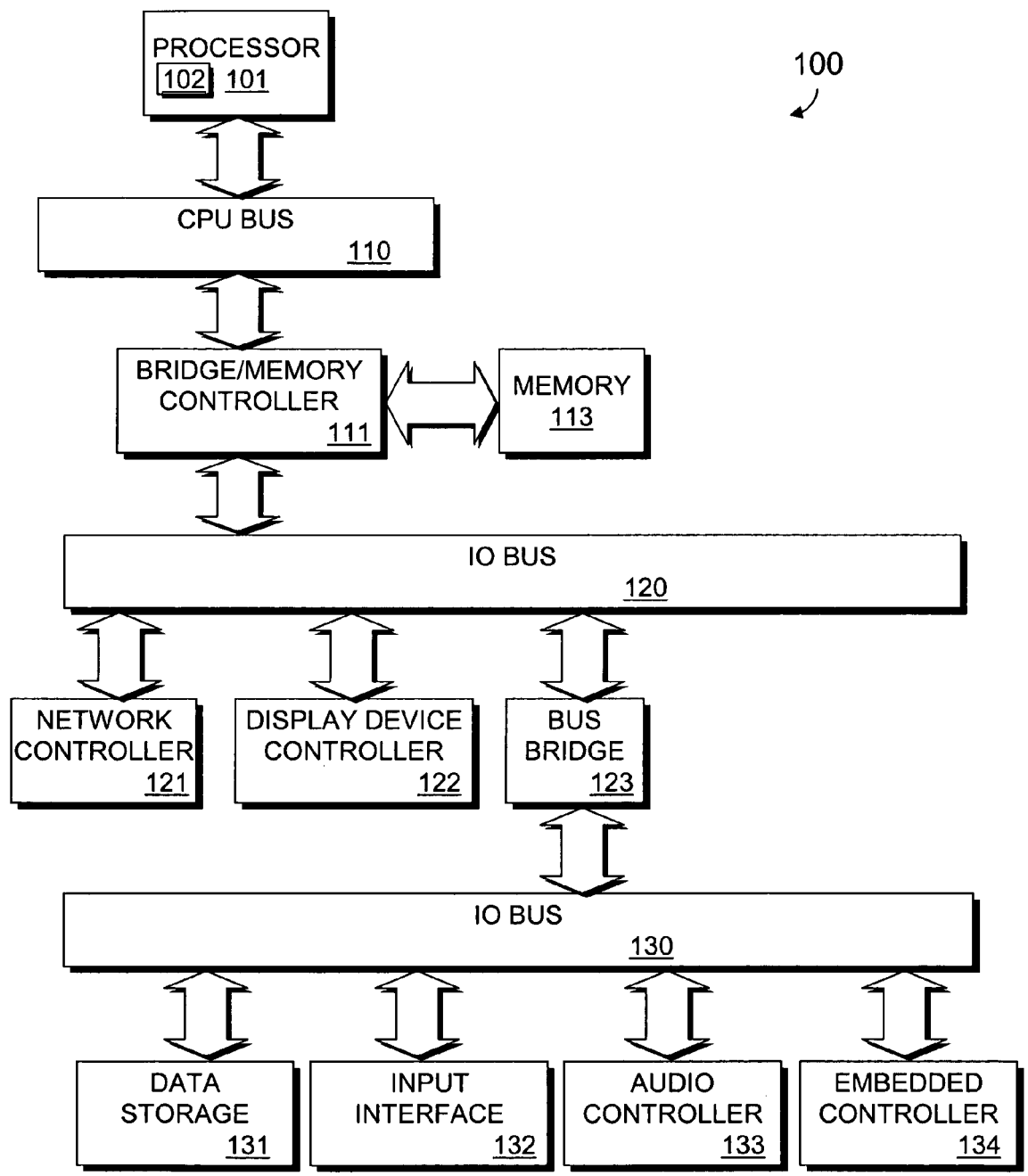

FIG. 1 is a block diagram of an exemplary computer system 100 in which an embodiment of the present invention resides in. The computer system 100 includes a processor 101 that processes data signals. The processor 101 may be a complex instruction set computer microprocessor, a reduced instruction set computing microprocessor, a very long instruction word microprocessor, a processor implementing a combination of instruction sets, or other processor device. FIG. 1 shows the computer system 100 with a single processor. However, it is understood that the computer system 100 may operate with multiple processors. The processor 101 is coupled to a CPU bus 110 that transmits data signals between processor 101 and other components in the computer system 100.

The computer system 100 includes a memory 113. The memory 113 may be a dynamic random access memory device, a static random access memory device, or other memory device. The memory 113 may store instructions and code represented by data signals that may be executed by the processor 101. A cache memory 102 resides inside processor 101 that stores data signals stored in memory 113. The cache 102 speeds up memory accesses by the processor 101 by taking advantage of its locality of access. In an alternate embodiment of the computer system 100, the cache 102 resides external to the processor 101. A bridge memory controller 111 is coupled to the CPU bus 110 and the memory 113. The bridge memory controller 111 directs data signals between the processor 101, the memory 113, and other components in the computer system 100 and bridges the data signals between the CPU bus 110, the memory 113, and a first IO bus 120.

The first IO bus 120 may be a single bus or a combination of multiple buses. The first IO bus 120 provides communication links between components in the computer system 100. A network controller 121 is coupled to the first IO bus 120. The network controller 121 may link the computer system 100 to a network of computers (not shown) and supports communication among the machines. A display device controller 122 is coupled to the first IO bus 120. The display device controller 122 allows coupling of a display device (not shown) to the computer system 100 and acts as an interface between the display device and the computer system 100.

A second IO bus 130 may be a single bus or a combination of multiple buses. The second IO bus 130 provides communication links between components in the computer system 100. A data storage device 131 is coupled to the second IO bus 130. The data storage device 131 may be a hard disk drive, a floppy disk drive, a CD-ROM device, a flash memory device or other mass storage device. An input interface 132 is coupled to the second IO bus 230. The input interface 132 may be, for example, a keyboard and/or mouse controller or other input interface. The input interface 132 may be a dedicated device or can reside in another device such as a bus controller or other controller. The input interface 132 allows coupling of an input device to the computer system 100 and transmits data signals from an input device to the computer system 100. An audio controller 133 is coupled to the second IO bus 130. The audio controller 133 operates to coordinate the recording and playing of sounds and is also coupled to the IO bus 130. An embedded controller 134 is coupled to the second IO bus 130. The embedded controller 134 may be an Advance Configuration and Power Interface (ACPI) (published 2003) compatible controller that is configured to support a smart battery (not shown) via a System Management Bus (SMBus) (published 1995). The smart battery may be used to provide power to the computer system 100 and provide information regarding its current charge capacity and discharge rate. It should be appreciated that the smart battery may be coupled to the computer system 100 using other interfaces and configurations. A bus bridge 123 couples the first IO bus 120 to the second IO bus 130. The bus bridge 123 operates to buffer and bridge data signals between the first IO bus 120 and the second IO bus 130.

Figure 2:
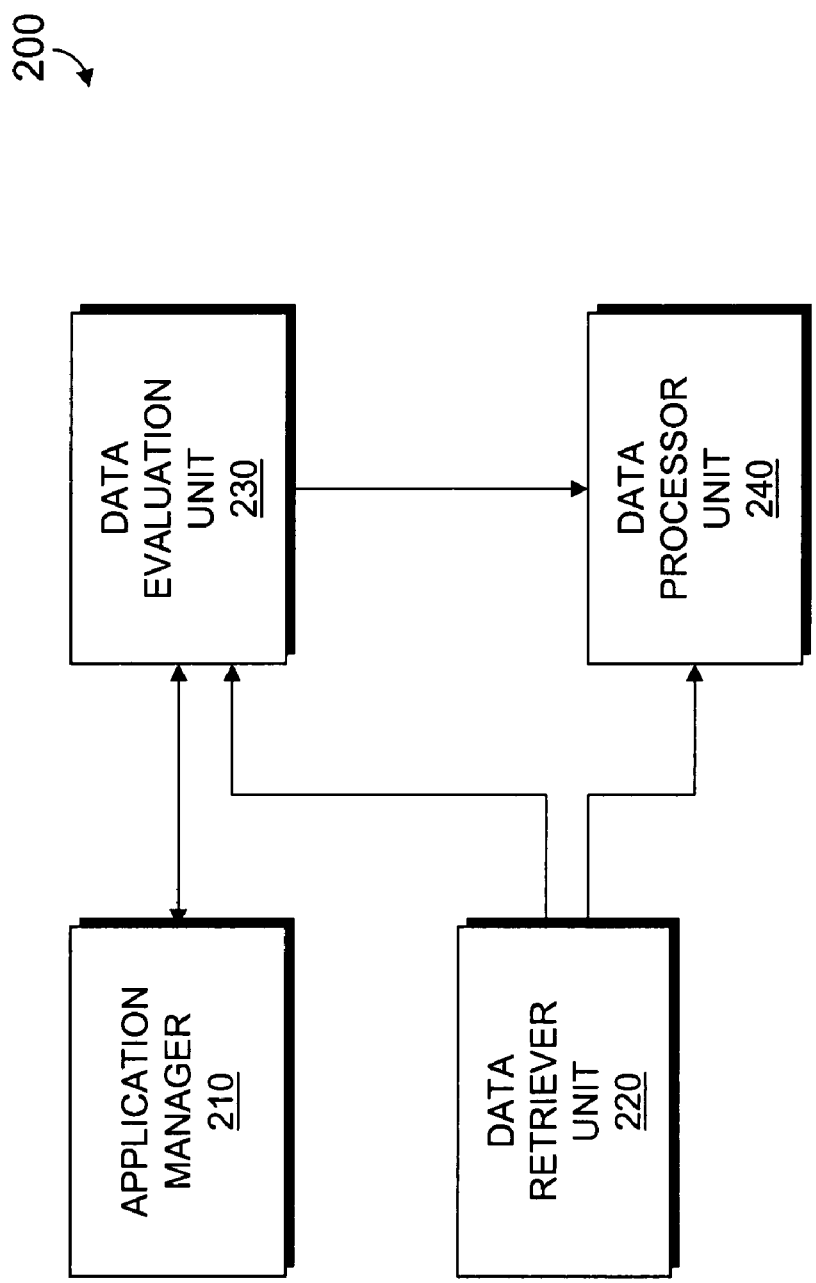
FIG. 2 is a block diagram of a power evaluation unit according to an embodiment of the present invention.

FIG. 2 is a block diagram of a power evaluation unit 200 according to an embodiment of the present invention. The power evaluation unit 200 includes a plurality of modules that may be implemented in software and reside in the memory 113 of the computer system 100 (shown in FIG. 1) as sequences of instructions. Alternatively, it should be appreciated that the modules of the power evaluation unit 200 may be implemented as hardware or a combination of both hardware and software. The power evaluation unit 200 includes an application manager 210. The application manager 210 controls the applications run on the computer system 100 during power evaluation such that the power evaluation unit 200 can collect desired power data. According to an embodiment of the power evaluation unit 200, the application manager 210 runs the application to be evaluated for a period of time, $T_{Application}$, after an idle period. During the period of time, $T_{Application}$, power data may be collected for the computer system 100 while running the application. The application manager 210 shuts down the application. After another idle period, power data may be collected for the computer system 100 in a baseline state (while the application is not running) for a period of time, $T_{Baseline}$.

According to an alternate embodiment of the present invention, the application is started and allowed to run until completion by the application manager 210. In this embodiment, the application manager 210 measures the run-time of the application and designates this run-time as $T_{Application}$. The application manager 210 may include a timer for performing this task. During the run-time, $T_{Application}$, data is collected from the computer system 100. After an idle period, power data may be collected for the computer system 100 in a baseline state for a period of time, $T_{Baseline}$. It should be appreciated that $T_{Application}$ may be determined and set using other techniques. For example, $T_{Application}$ may be determined manually by a computer system user.

During the periods of time $T_{Application}$ and $T_{Baseline}$, all other devices and activities on the computer system 100, with the exception of the application, are set to operate identically in order to obtain accurate power data for computing absolute and background power consumption.

Figure 3:
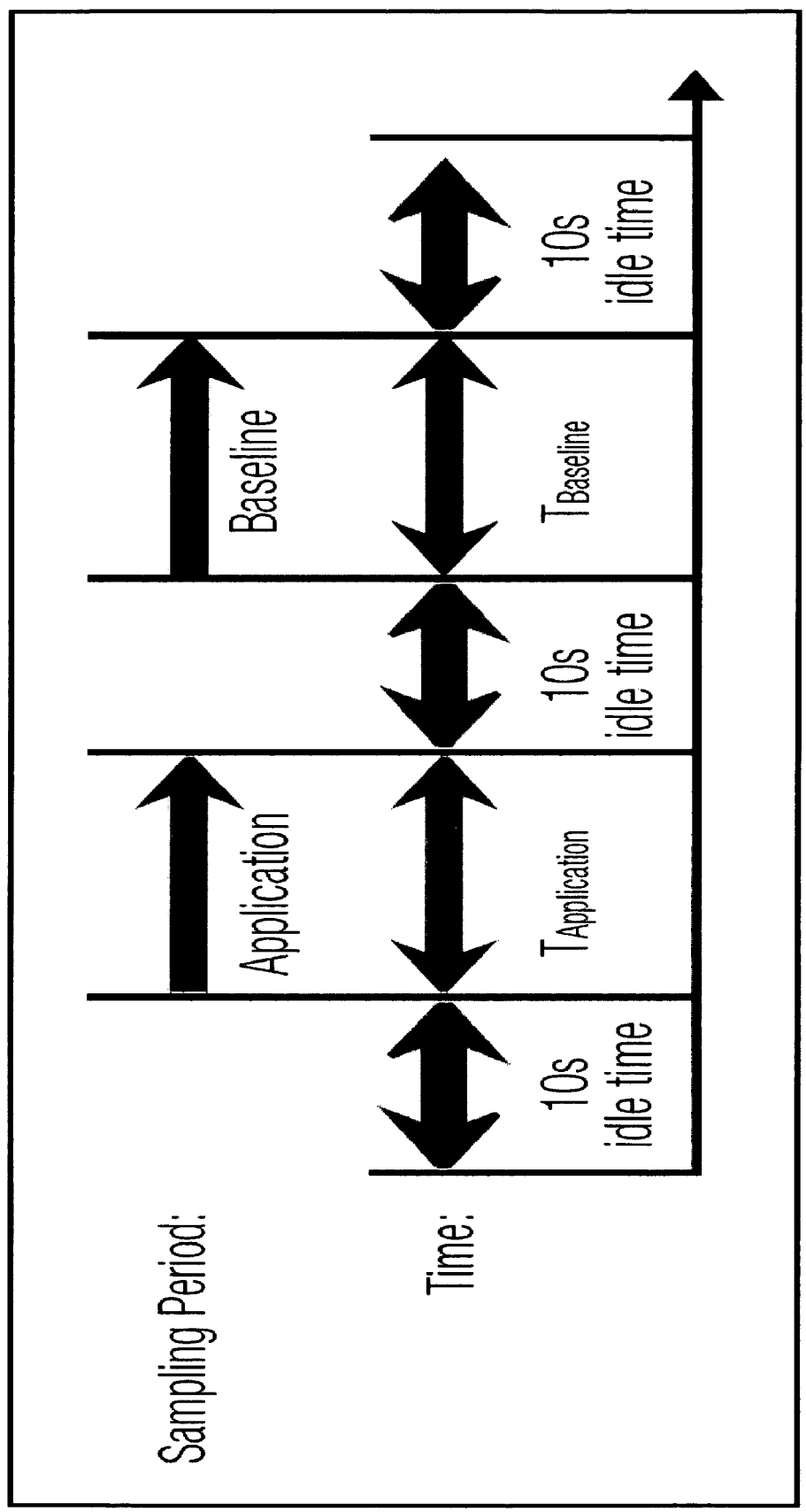
FIG. 3 illustrates a time table of a measurement methodology according to an embodiment of the present invention.

FIG. 3 illustrates a time table of a measurement methodology according to an embodiment of the present invention. In this embodiment, an idle period of 10 seconds is used before collecting power data for the computer system 100 (shown in FIG. 1) while running the application, and before collecting power data for the computer system 100 while the application is not running. It should be appreciated that the idle period may be of any time duration and that power data may be collected during the idle period and not considered for the purpose of computing absolute and net power.

Referring back to FIG. 2, the power evaluation unit 200 includes a data retriever unit 220. The data retriever unit 220 interfaces the operating system (not shown) of the computer system 100 (shown in FIG. 1) to retrieve power data. According to an embodiment of the power evaluation unit 200, the power data includes power capacity and discharge rate data supplied by a smart battery powering the computer system 100. Alternatively, the power capacity and discharge rate data may be supplied by a hardware component measuring equivalent characteristics from the computer system 100 from an alternative power source powering the computer system 100 such as an AC power source. It should be appreciated that the data retriever unit 220 may provide other system/application data at the sample points. For example, the system/application data may include CPU frequency, CPU utilization, or other data. The power evaluation unit 200 may correlate the system/application data with the power data at the sample points.

The power evaluation unit 200 includes a data evaluation unit 230. The data evaluation unit 230 receives information from the application manager 210 including the approximate time in which an application is running on the computer system. The data evaluation unit 230 also receives power data from the data retriever unit 220. The data evaluation unit 230 determines the quality of the power data. According to an embodiment of the power evaluation unit 200, the data evaluation unit 230 computes a systematic error related to an update granularity of the power data. If the computed systematic error exceeds a threshold value, the data evaluation unit 230 generates a notification and/or provides a suggestion as to how to reduce the systematic error to an acceptable level. In one embodiment, the data evaluation unit 230 computes a period of time, $T_{Application}$, in which the application may run that may reduce the systematic error.

The power evaluation unit 200 includes a data processor unit 240. The data processor unit 240 receives the power data from the data retriever unit 220 and an indication of whether the systematic error associated with the power data is acceptable. According to one embodiment, if the systematic error associated with the power data is acceptable, the power evaluation unit 200 computes the absolute power required for operating the computer system 100 with the application and the net power required for running the application alone. The data processor unit 240 first computes the absolute power for operating the computer system 100 and the application by determining the power used by the computer system 100 and the application during the time period $T_{Application}$. The data processor unit 240 then computes the background power for operating the computer system 100 during a baseline state without running the application during the time period $T_{Baseline}$. From these values, the data processor unit 240 is able to determine the net power required for running the application alone. According to one embodiment, the data processor unit 240 computes the absolute and net power values using power capacity and discharge rates separately. The absolute and/or net power values computed are compared to determine the accuracy of the results.

Figure 4:
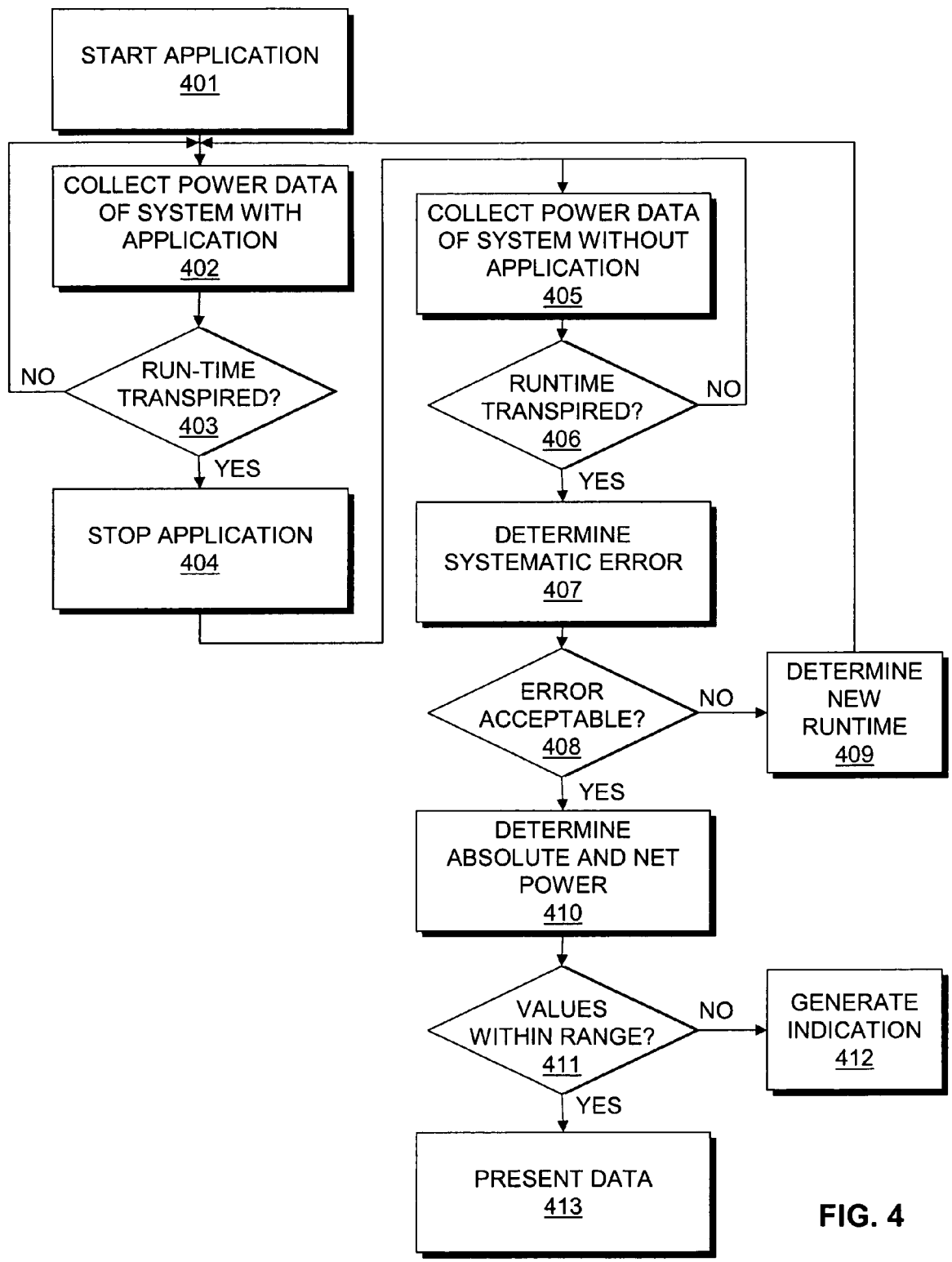
FIG. 4 is a flowchart diagram illustrating a method for managing power data according to an embodiment of the present invention.

FIG. 4 is a flowchart diagram illustrating a method for managing power data according to an embodiment of the present invention. At 401, the application to be evaluated is started.

At 402, power data from the computer system on which the application is run is collected. According to an embodiment of the present invention, the power data is sampled from a smart battery powering the computer system and transmitted to the operating system of the computer system where it may be accessed. The power data may include the power capacity of the battery and the discharge rate of the battery.

At 403, it is determined whether the run-time for collecting power data corresponding to the running of the application, $T_{Application}$, has transpired. If the run-time for collecting power corresponding to the running of the application has not transpired, control returns to 402. If the run-time for collecting power data corresponding to the running of the application has transpired, control proceeds to 404. According to an embodiment of the present invention, a predefined time period is initially set for the run-time.

At 404, the application is stopped.

At 405, power data from the computer system without the application running is collected. The power data collected may include the power capacity and the discharge rate of the battery powering the computer system. It should be appreciated that at 402 and 405 system/application data may also be collected during the periods of time that power data is collected.

At 406, it is determined whether the run-time for collecting power data corresponding to the application not running, $T_{Baseline}$, has transpired. If the run-time for collecting power data corresponding to the application not running has not transpired, control returns to 405. If the run-time corresponding to the application not running has transpired, control proceeds to 407. According to an embodiment of the present invention, run-time $T_{Baseline}$ is set to $T_{Application}$.

At 407, a systematic error for the power data collected is determined. According to one embodiment, the systematic error may be determined in response to the update granularity (frequency) of the power data provided by the smart battery.

At 408, it is determined whether the systematic error is acceptable. The systematic error may be compared with a threshold systematic error value. If the systematic error is not acceptable, control proceeds to 409. If the systematic error is acceptable, control proceeds to 410.

At 409, a new run-time for collecting power data corresponding to the running of the application, $T_{Application}$, is computed to reduce the systematic error so that the error is acceptable. An indication may also be generated that indicates that the systematic error for the power data has exceeded a threshold value and that the power data is not acceptable. Control proceeds to 402. According to an alternate embodiment of the present invention, only an indication that the systematic error has exceeded a threshold value and that the power data is not acceptable is generated without the determining of a new run-time and the re-collection of power data. In this embodiment, the net power consumption of the application is not determined.

At 410, the absolute and net power consumption of the computer system is determined. In computing the absolute power consumption of the computer system, the difference is taken of the power capacity values collected at the start and the end of the time period $T_{Application}$. This value for the absolute power consumption of the computer system represents the power required for running the application and other background processes on the computer system. The background power consumption of the computer system is determined by taking the difference of the power capacity values collected at the start and the end of the time period $T_{Baseline}$. This value for the background power consumption of the computer system represents the power required for running the computer system without running the application. To determine the net power consumption, the difference between the absolute power consumption and the background power consumption is taken.

According to an embodiment of the present absolute power consumption and net power consumption of the computer system is also determined using a second technique. In computing the absolute power consumption of the computer system with the second technique, the drain rate data is numerically integrated between the start and end of the time period $T_{Application}$. Similarly, the background power consumption for the computer system is determined using the second technique by numerically integrating the drain rate data between the start and end of the time period $T_{Baseline}$. The net power consumption is determined by taking the difference between the absolute power consumption and the background power consumption.

At 411, the absolute power consumption and net power consumption values determined using the power capacity and drain rate data are compared. If the absolute power consumption and net power consumption values are not within a predetermined range, control proceeds to 412. If the absolute power consumption and net power consumption values are within a predetermined range, control proceeds to 413.

At 412, an indication is generated indicating that the absolute power consumption and net power consumption values computed using power capacity and drain rate values are inconsistent.

At 413, the absolute power consumption and net power consumption values are presented. According to an embodiment of the present invention, processor utilization data is collected. In this embodiment, net power consumption values are presented only if the processor utilization is a predetermined threshold value greater during the run-time period $T_{Application}$ than during the baseline period.

According to an alternate embodiment of the present invention, the run-time period $T_{Application}$ is determined after the application has run and is allowed to complete. In this embodiment, $T_{Application}$ is not pre-defined and procedures 403 and 404 are not utilized. It should be appreciated that in this embodiment, when a new run-time is determined at 409 the application may require a change in workload in order to change the run-time. The change in workload may be altered by the application manager 210 or manually by a user of the computer system 100 (shown in FIG. 1).

Figure 5:
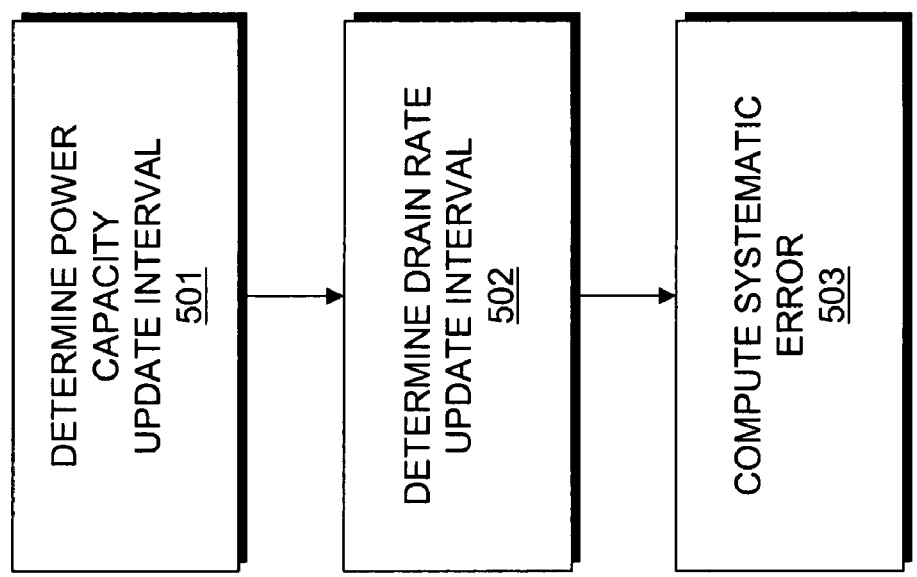
FIG. 5 is a flow chart illustrating a method for measuring the quality of power data according to an embodiment of the present invention.

FIG. 5 is a flow chart illustrating a method for measuring the quality of power data according to an embodiment of the present invention. This procedure may be used to determine the systematic error due to update granularity of the power data as referenced in 407 of FIG. 4. At 501, the power capacity data update interval (frequency) is determined. According to an embodiment of the present invention, the power capacity data update interval may be determined by observing the power capacity data over a period of time and measuring the amount of time the power capacity data changes during the time period $T_{Application}$. Since the power capacity of a battery in a computer system running on battery can only decrease, no consecutive power capacity data provided by the battery should be identical. The maximum duration required for a change is designated as the power capacity data update interval.

At 502, the drain rate data update interval (frequency) is determined. According to an embodiment of the present invention, the drain rate data update interval may be determined by observing the drain rate data over a period of time and measuring the amount of time the drain rate data changes during the time period $T_{Application}$. Since power consumption in a computer system is constantly in fluctuation, no consecutive drain rate data of a battery in a computer system should be identical. The maximum duration required for a change is designated as the drain rate data update interval.

At 503, the systematic error is computed. According to an embodiment of the present invention, the larger of the power capacity and drain rate data update interval is divided by the time period $T_{Application}$. This provides the upper bound of the systematic error percentage due to update granularity of the power data.

Power capacity and drain rate data update interval is a system characteristic that may not be adjustable. Thus, the time period $T_{Application}$ may be extended in order to reduce the systematic error. According to an embodiment of the present invention, this technique may be used to compute a new run-time, $T_{Application}$, in order to reduce the systematic error to an acceptable level.

FIGS. 4 and 5 are flow charts illustrating embodiments of the present invention. Some of the procedures illustrated in the figures may be performed sequentially, in parallel or in an order other than that which is described. For example, procedures 407-409 may be performed immediately after 404. It should be appreciated that not all of the procedures described are required, that additional procedures may be added, and that some of the illustrated procedures may be substituted with other procedures.

Figure 6:
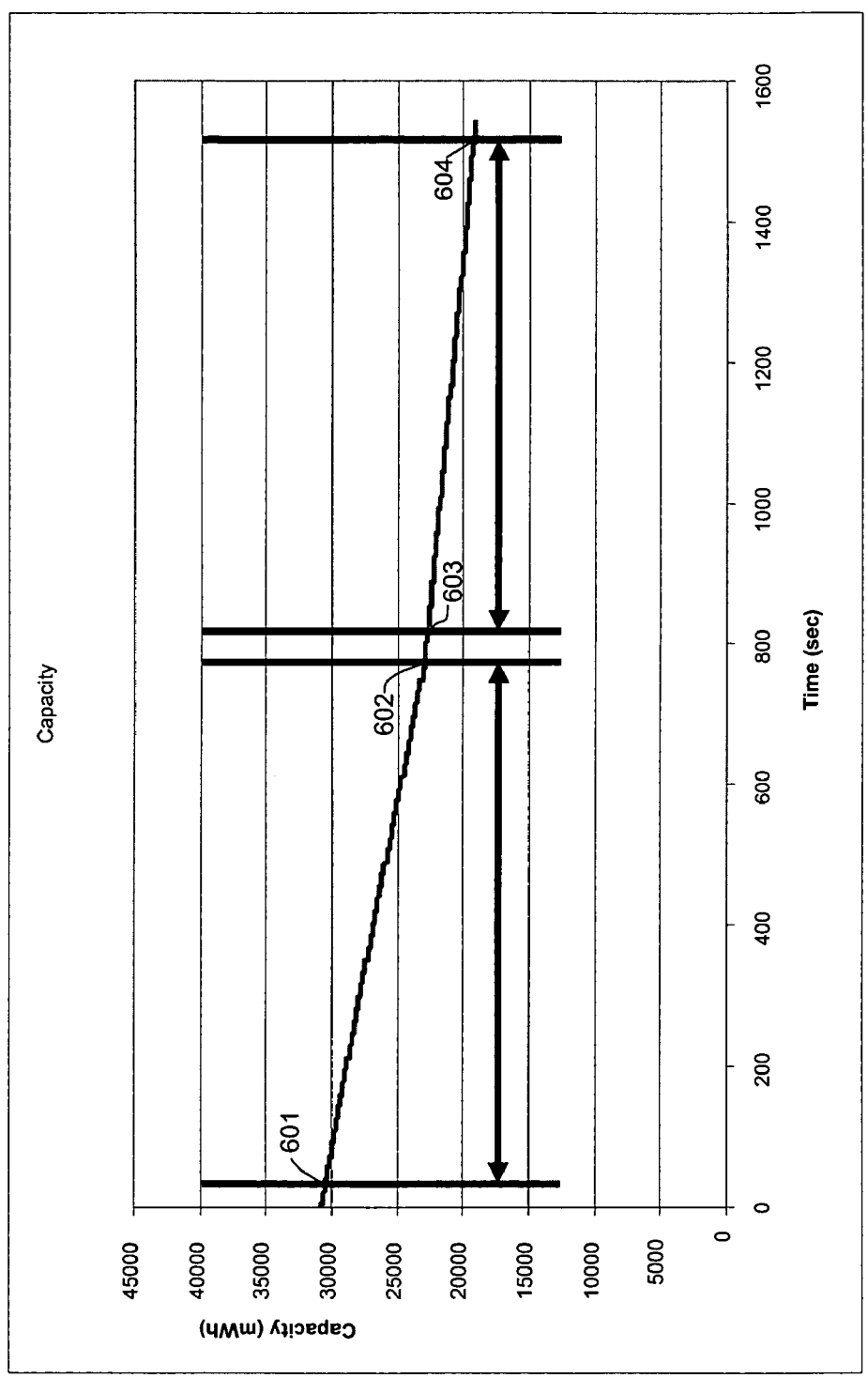
FIG. 6 illustrates exemplary power capacity data collected for a computer system according to an embodiment of the present invention.

FIG. 6 illustrates exemplary power capacity data collected according to an embodiment of the present invention. FIG. 6 shows a line that connects points of data collected for power capacity, measured in milliwatts hours, over time, measured in seconds. The run-time where the computer system ran the application evaluated is labeled as $T_{Application}$ defined by sample points 601 and 602. The run-time where the computer system did not run the application is labeled as $T_{Baseline}$ defined by sample points 603 and 604.

Figure 7:
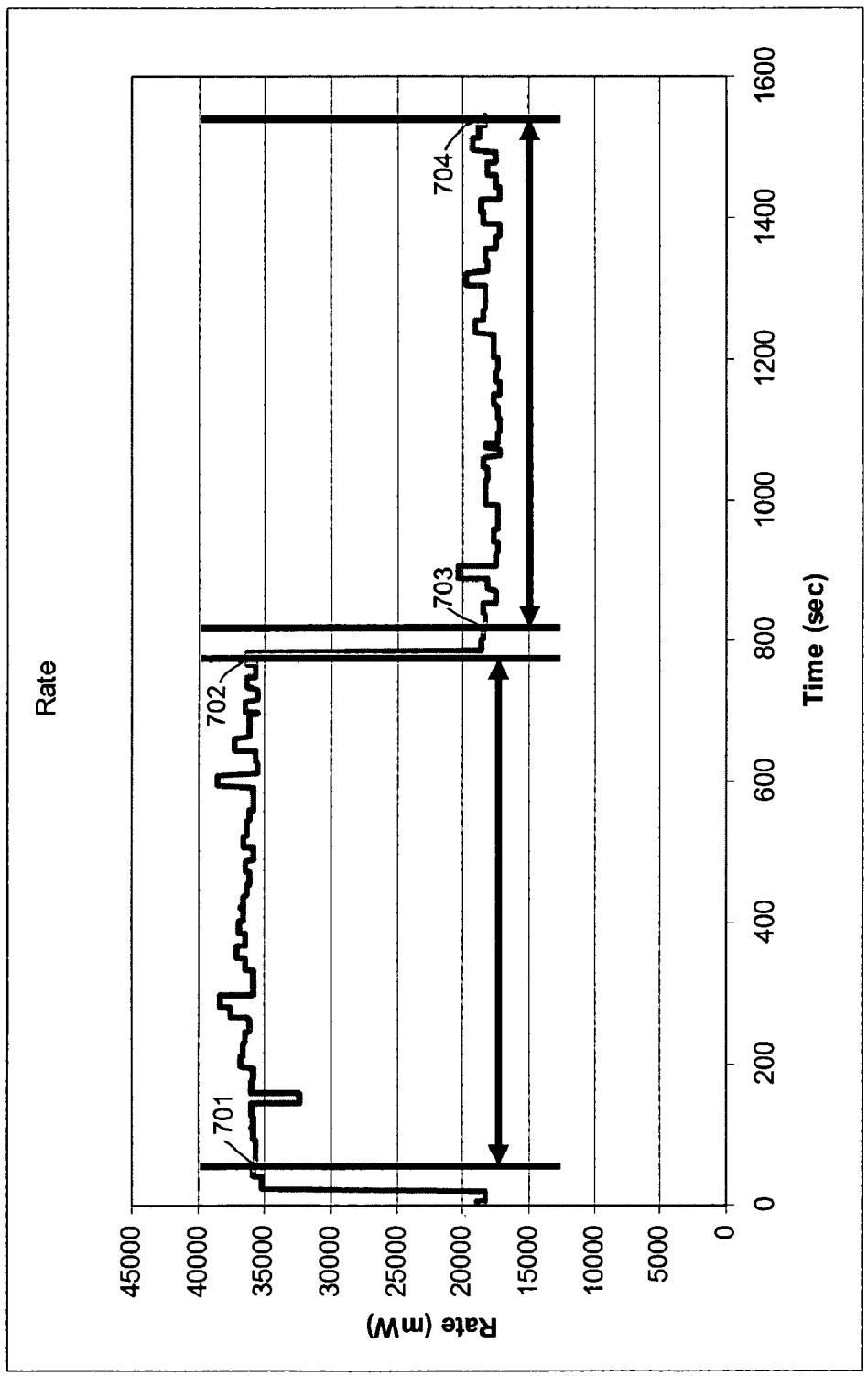
FIG. 7 illustrates exemplary discharge rate data collected for a computer system according to an embodiment of the present invention.

FIG. 7 illustrates exemplary discharge rate data collected according to an embodiment of the present invention. FIG. 7 shows a line that connects points of data collected for discharge rate, measured in milliwatts, over time, measured in seconds. The run-time where the computer system ran the application evaluated is labeled as $T_{Application}$ defined by sample points 701 and 702. The run-time where the computer system did not run the application is labeled as $T_{Baseline}$ defined by sample points 703 and 704.

Figure 8:
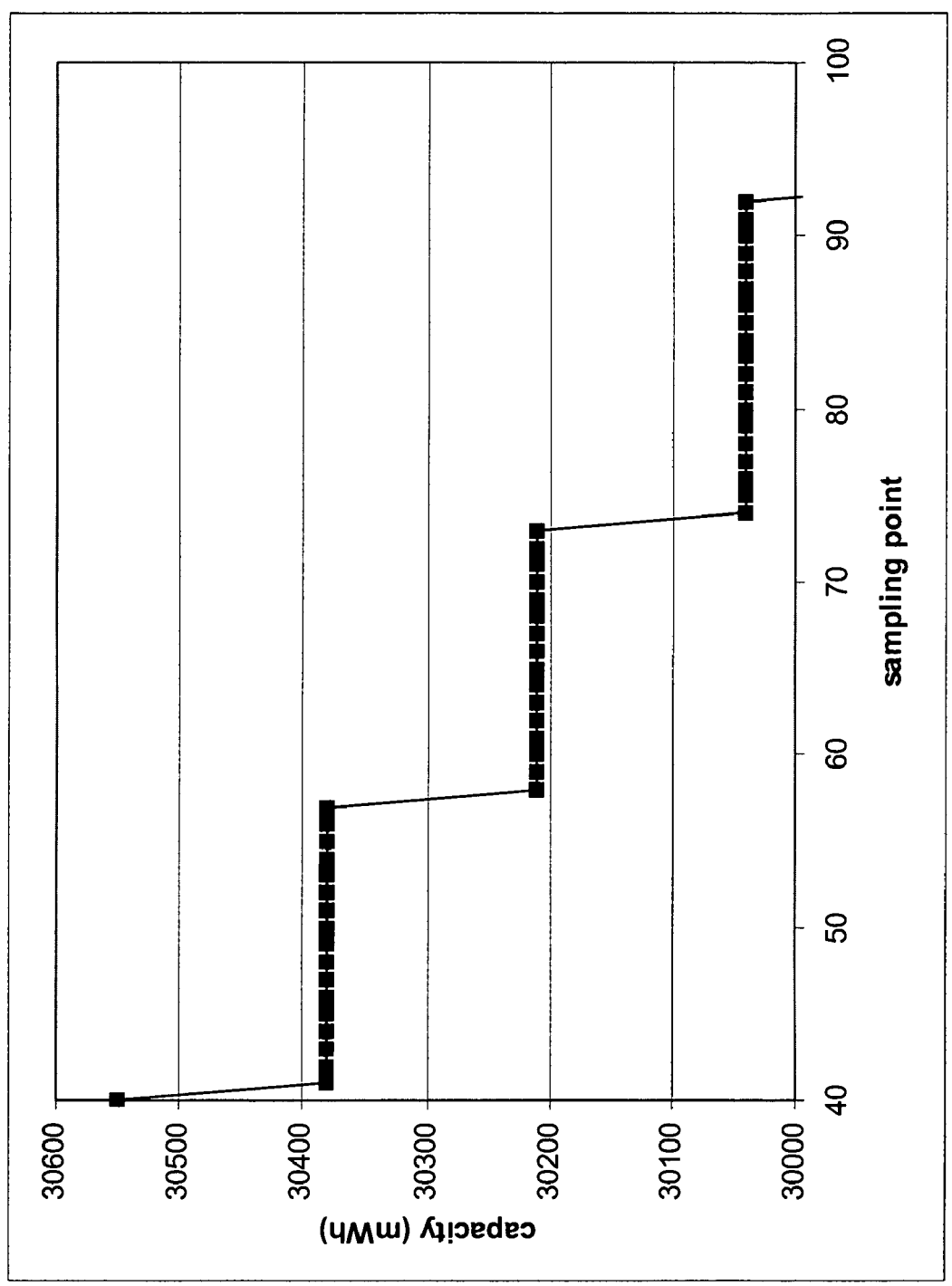
FIG. 8 illustrates the correlation between sampling points taken by a power evaluation unit and the power capacity data provided by a smart battery.

FIG. 8 illustrates the correlation between sampling points taken by the power evaluation unit 200 (shown in FIG. 2) and power capacity data provided by the computer system 100 (shown in FIG. 1) according to an embodiment of the present invention. In this example, the power evaluation unit 200 is sampling every second while the power capacity appears to be changing approximately every 19 seconds because the update granularity of the battery information is approximately 19 seconds. Increasing the sampling rate of the power evaluation tool 200 provides for "sharper" steps, but does not increase the update on the frequency of the power capacity data provided by the computer system.

FIG. 9 is a table illustrating information generated by the power evaluation unit 200 (shown in FIG. 2) according to an embodiment of the present invention. According to an embodiment of the present invention, the power evaluation unit 200 selects sampled points that are closest to the actual start and end time of $T_{Application}$ and $T_{Baseline}$ when actual points are not sampled at those instances. Alternatively, it should be appreciated that the power evaluation unit 200 may estimate a value at the actual start and end time of $T_{Application}$ and $T_{Baseline}$ where actual points are not sampled at those instances. At 901, the elapsed time of process, $T_{Application}$, is listed. According to an embodiment of the present invention, the elapsed time of process may be calculated by taking the difference between the start and end times indicated by points 601 and 602 on FIG. 6 and points 701 and 702 on FIG. 7. According to an alternate embodiment of the present invention, the elapsed time of process may be determined by the completion time of the application as allowed to run.

At 902, the power consumption of the application and background processes (absolute power) computed using power capacity data is shown. The absolute power may be calculated by taking the difference in power capacity at the start and at the end of the run-time $T_{Application}$ indicated by points 601 and 602.

At 903, the power consumption of the background processes (background power) when the computer system 100 (shown in FIG. 1) is in the baseline state is shown. The background power may be calculated by taking the difference in power capacity at the start and at the end of run time $T_{Baseline}$ indicated by points 603 and 604.

At 904, the power consumption of the application running on the computer system (net power) computed using power capacity data is shown. The net power may be calculated by subtracting the background power shown in 903 from the absolute power shown in 902.

At 905, the power consumption of the application and background processes (absolute power) computed using drain rate data is shown. The absolute power may be calculated by numerically integrating the drain rate between the start and end points of $T_{Application}$ indicated by points 701 and 702.

At 906, the power consumption of the background processes (background power) when the computer system 100 is in the baseline state is shown. The background power may be calculated by numerically integrating the drain rate between the start and end points of $T_{Baseline}$ indicated by points 703 and 704.

At 907, the power consumption of the application running on the computer system (net power) computed using drain rate data is shown. The net power may be calculated by subtracting the background power shown in 906 from the absolute power shown in 905.

At 908, the power capacity data update interval is shown. The power capacity data update interval appears as a step function with discrete steps in FIG. 8. The duration of each step can be measured to determine the update frequency of the power capacity data from the smart battery. The longest duration of all recorded steps during $T_{Application}$ is designated as the power capacity update interval.

At 909, the drain rate data update interval is shown. Similar to the power capacity update interval, the drain rate data update interval also appears as a step function with discrete steps. The duration of each step can be measured to determine the update frequency of the drain rate data from the smart battery. The longest duration of all recorded steps during $T_{Application}$ is designated as the drain rate update interval.

At 910, the systematic error of the power data is shown. The systematic error of the power data may be calculated by dividing the larger of the two update intervals shown in 908 and 909 by the elapsed time shown in 901.

In the foregoing specification, the embodiments of the present invention have been described with reference to specific exemplary embodiments thereof. It will, however, be evident that various modifications and changes may be made thereto without departing from the broader spirit and scope of the embodiments of the present invention. The specification and drawings are, accordingly, to be regarded in an illustrative rather than restrictive sense.

What is claimed is:

1. A method for managing power data, comprising:
   determining an amount of power used by a system running an application over a first time period from power data supplied to an operating system by a battery over the first time period;
   determining an amount of power used for the system in a baseline state over a second time period from power data supplied to the operating system by the battery over the second time period, wherein the power data includes a power capacity and a drain rate of the battery;
   determining a net power consumption of the application from the amount of power used by the system running the application and the amount of power used by the system in the baseline state;
   determining a systematic error of the power data used for determining the amount of power used by the system running the application by dividing an update granularity of the power data by the first time period; and
   generating an indication to a user if the systematic error exceeds a predetermined value.

2. The method of claim 1, wherein determining the amount of power used by the system running the application comprises subtracting a power capacity value of a battery at an end of the first time period from a power capacity value of the battery at a beginning of the first time period.

3. The method of claim 1, wherein determining the amount of power used by the system running the application comprises integrating a drain rate of the battery over the first time period.

4. The method of claim 1, wherein determining the amount of power used for by the system in the baseline state comprises subtracting a power capacity value of the battery at an end of the second time period from the power capacity value of the battery at a beginning of the second time period.

5. The method of claim 1, wherein determining the amount of power used by the system in the baseline state comprises integrating a drain rate of the battery over the second time period.

6. The method of claim 1, wherein determining the net power consumption of the application comprises subtracting the amount of power used by the system in the baseline state over the second time period from the amount of power used by the system running the application over the first time period.

7. The method of claim 1, further comprising providing a suggested run-time to reduce the systematic error.

8. A method for managing power data, comprising:
   collecting power data for a system running an application supplied to an operating system from a battery over a first time period;
   collecting power data for the system in a baseline state supplied to the operating system from the battery over a second time period, wherein the power data includes a power capacity and a drain rate of the battery;
   determining a systematic error of an update frequency for the power data;
   generating a new run-time to run the application and displaying the new run-time to a user if the systematic error of the update frequency exceeds a threshold value; and
   determining a net power consumption of the application from the power data if the systematic error of the update frequency exceeds the threshold value.

9. The method of claim 8, wherein the first time period and the second time period are of equal duration.

10. The method of claim 8, further comprising transmitting an indication that the power data is invalid if the systematic error of the update frequency exceeds the threshold value.

11. The method of claim 8, further comprising:
    collecting power data for the system running the application from the operating system over a third time period with the new run-time;
    collecting power data for the system in the baseline state from the operating system over a fourth time period with the new run-time; and
    determining a net power consumption of the application from the power data.

12. An article of manufacture comprising a machine accessible medium including sequences of instructions the sequences of instructions including instructions which when executed causes the machine to perform:
    determining an amount of power used by a system running an application over a first time period from power data supplied to an operating system by a battery over the first time period;
    determining an amount of power used by the system in a baseline state over a second time period from power data supplied to the operating system by the battery over the second time period, wherein the power data is one of a power capacity and a drain rate of the battery;
    determining a net power consumption of the application from the amount of power used by the system running the application and the amount of power used by the system in the baseline state;
    determining a systematic error of the power data used for determining the amount of power used by the system running the application by determining an update granularity of the power data and dividing the update granularity of the power data by the first time period; and
    generating an indication to a user if the systematic error exceeds a predetermined value.

13. The article of manufacture of claim 12, wherein determining the net power consumption of the application comprises computing a first net power value using power capacity data and a second net power data using drain rate data.

14. The article of manufacture of claim 13, further comprising sequences of instructions including instructions which when executed performs generating an indication if the difference between the first and the second net power values exceeds a threshold value.

15. The article of manufacture of claim 13, further comprising sequences of instructions including instructions which when executed performs providing a suggested run-time to reduce the systematic error.

16. A method for managing power data, comprising:
    determining an amount of power used by a system running an application over a first time period from power data supplied to an operating system by a battery over the first time period;
    determining an amount of power used for the system in a baseline state over a second time period from power data supplied to the operating system by the battery over the second time period;
    determining a net power consumption of the application from the amount of power used by the system running the application and the amount of power used by the system in the baseline state by computing a first net power value using power capacity data and a second net power data using drain rate data; and
    generating an indication to a user if the difference between the first and the second net power values exceeds a threshold value.

17. The method of claim 16, further comprising determining a systematic error of the power data used for determining the amount of power used by the system running the application.

18. The method of claim 17, wherein determining the systematic error comprises: determining an update granularity of the power data; and
    dividing the update granularity of the power data by the first time period.

19. The method of claim 17, further comprising generating an indication if the systematic error exceeds a predetermined value.

20. The method of claim 17, further comprising providing a suggested run-time to reduce the systematic error.

21. A method for managing power data, comprising:
    determining an amount of power used by a system running an application over a first time period from power data supplied to an operating system by a battery over the first time period;
    determining an amount of power used for the system in a baseline state over a second time period from power data supplied to the operating system by the battery over the second time period, wherein the power data includes a power capacity and a drain rate of the battery;
    determining a net power consumption of the application from the amount of power used by the system running the application and the amount of power used by the system in the baseline state by subtracting the amount of power used by the system in the baseline state over the second time period from the amount of power used by the system running the application over the first time period; and
    generating an indication of the net power consumption of the application to a user.

22. The method of claim 21, further comprising:
    determining a systematic error of the power data used for determining the amount of power used by the system running the application; and
    generating an indication to the user if the systematic error exceeds a predetermined threshold.

23. The method of claim 22, wherein determining the systematic error of the power data comprises determining an update granularity of the power data and dividing the update granularity of the power data by the first time period.

24. The method of claim 21, wherein determining the amount of power used by the system running the application comprises integrating a drain rate of the battery over the first time period.

25. The method of claim 21, wherein determining the amount of power used by the system in the baseline state comprises integrating a drain rate of the battery over the second time period.

26. A method for managing power data, comprising:
    determining an amount of power used by a system running an application over a first time period from power data supplied to an operating system by a battery over the first time period;
    determining an amount of power used for the system in a baseline state over a second time period from power data supplied to the operating system by the battery over the second time period, wherein the power data includes a power capacity and a drain rate of the battery;
    determining a net power consumption of the application from the amount of power used by the system running the application and the amount of power used by the system in the baseline state;
    generating an indication of the net power consumption of the application to a user;
    determining a systematic error of the power data used for determining the amount of power used by the system running the application by determining an update granularity of the power data and dividing the update granularity of the power data by the first time period; and
    generating an indication to the user if the systematic error exceeds a predetermined threshold.

27. The method of claim 26, wherein determining the amount of power used by the system running the application comprises integrating a drain rate of the battery over the first time period.

28. The method of claim 26, wherein determining the amount of power used by the system in the baseline state comprises integrating a drain rate of the battery over the second time period.

* * * * *